(12) United States Patent
Bhat et al.

(10) Patent No.: US 11,716,087 B1
(45) Date of Patent: Aug. 1, 2023

(54) CALIBRATION LOOP FOR DIFFERENTIAL SUB-SAMPLING PHASE DETECTOR IN SUB-SAMPLING PHASE LOCKED LOOP

(71) Applicant: Cisco Technology, Inc., San Jose, CA (US)

(72) Inventors: Abhishek Bhat, Allentown, PA (US); Romesh Kumar Nandwana, Breinigsville, PA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/582,466

(22) Filed: Jan. 24, 2022

(51) Int. Cl.
*H03L 7/091* (2006.01)
*H03L 7/099* (2006.01)

(52) U.S. Cl.
CPC ............ *H03L 7/091* (2013.01); *H03L 7/0992* (2013.01)

(58) Field of Classification Search
CPC .............................. H03L 7/091; H03L 7/0992
See application file for complete search history.

(56) References Cited

U.S. PATENT DOCUMENTS

| | | | |
|---|---|---|---|
| 7,400,173 B1 | 7/2008 | Kwong et al. | |
| 9,306,585 B1* | 4/2016 | Elkholy | H03L 7/0814 |
| 10,651,858 B2* | 5/2020 | Ott | H03L 7/22 |
| 10,826,503 B1 | 11/2020 | Chen | |
| 10,895,850 B1* | 1/2021 | Elkholy | G04F 10/005 |
| 10,979,059 B1 | 4/2021 | Shalmani et al. | |
| 11,005,482 B1* | 5/2021 | Stuenkel | H03L 7/099 |
| 2004/0170245 A1 | 9/2004 | Hairapetian et al. | |
| 2015/0145566 A1* | 5/2015 | Perrott | H03L 7/0994 327/159 |
| 2015/0214966 A1* | 7/2015 | Tong | H03L 7/0992 327/157 |
| 2018/0367027 A1* | 12/2018 | Chen | H02M 1/36 |
| 2019/0212703 A1* | 7/2019 | Yao | H03L 7/099 |
| 2019/0214976 A1* | 7/2019 | Wu | H03L 7/0805 |
| 2019/0326915 A1* | 10/2019 | Moslehi Bajestan | H03L 7/0895 |
| 2020/0177173 A1 | 6/2020 | Wu et al. | |
| 2020/0295769 A1* | 9/2020 | Hermoso | H03C 3/0966 |

(Continued)

FOREIGN PATENT DOCUMENTS

| | | | | |
|---|---|---|---|---|
| KR | 20190037816 A | * | 4/2019 | |
| WO | WO-2009055103 A2 | * | 4/2009 | G06F 1/04 |

(Continued)

OTHER PUBLICATIONS

Bingwei Jiang et al., "A 23-mW 60-GHz Differential Sub-Sampling PLL with an NMOS Only Differential-Inductively-Tuned VCO", IEEE Asian Solid-State Circuits Conference, Nov. 4-6, 2019, 4 pages.

(Continued)

*Primary Examiner* — Adam D Houston
(74) *Attorney, Agent, or Firm* — Edell, Shapiro & Finnan, LLC

(57) ABSTRACT

Presented herein are techniques for implementing a differential sub-sampling phase locked loop (PLL). A method includes detecting a common-mode voltage on an output of a differential sub-sampling phase detector operating in the differential sub-sampling phase locked loop, and controlling, based on the common-mode voltage, a duty cycle of a feedback signal of the differential sub-sampling phase locked loop that is fed back to the differential sub-sampling phase detector.

20 Claims, 11 Drawing Sheets

(56) References Cited

U.S. PATENT DOCUMENTS

2021/0409029 A1* 12/2021 Moslehi Bajestan ..... H03L 7/16
2023/0029340 A1* 1/2023 Baek ....................... H03L 7/081

FOREIGN PATENT DOCUMENTS

WO    WO-2020124030 A1 * 6/2020 ............... H03B 5/02
WO    WO-2021178147 A1 * 9/2021 ........... H03B 5/1212

OTHER PUBLICATIONS

Wanghua Wu et al., "A 28-nm 75-fsrms Analog Fractional-N Sampling PLL With a Highly Linear DTC Incorporating Background DTC Gain Calibration and Reference Clock Duty Cycle Correction", IEEE Journal of Solid-State Circuits, vol. 54, No. 5, May 2019, 12 pages.

Viki Szortyka et al., "A 42 mW 200 fs-Jitter 60 GHz Sub-Sampling PLL in 40 nm CMOS", IEEE Journal of Solid-State Circuits, vol. 50, No. 9, Sep. 2015, 12 pages.

Abhishek Bhat et al., "A Reduced-Area Capacitor-Only Loop Filter With Polarity-Switched Gm for Large Multiplication Factor Millimeter-Wave Sub-Sampling PLLs", IEEE Transactions On Circuits and Systems—I: Regular Papers, vol. 69, No. 1, Jan. 2022, 12 pages.

\* cited by examiner

CALIBRATION LOOP FOR DIFFERENTIAL SUB-SAMPLING PHASE DETECTOR IN SUB-SAMPLING PHASE LOCKED LOOP

TECHNICAL FIELD

The present disclosure relates to clocking circuitry for high speed wireline and wireless communication systems, and more particularly to a phase locked loop employed in such circuitry.

BACKGROUND

Higher data rates in both wireline and wireless communication systems pose design challenges for clocking circuits. One of those challenges is to provide a satisfactory phase locked loop (PLL), which is one of the more critical functional blocks for low jitter on-chip clocks. Typically, a PLL is designed using single-ended circuit including, e.g., a phase detector, transconductance amplifier (Gm), voltage controlled oscillator (VCO) gain control, loop filter, etc. However, a single-ended PLL is very sensitive to common-mode noise, and thus requires significant supply-ground decoupling capacitance, which can consume a considerable amount of chip real estate.

Further, in a single-ended PLL design, the control node voltage of the VCO is particularly sensitive to common-mode noise. Further still, the non-linearity of Kvco (the gain of the control port of the VCO) can fold-back noise in the case of a fractional-N PLL and increases the jitter in the output clock.

DESCRIPTION OF EXAMPLE EMBODIMENTS

Overview

Figure 1:
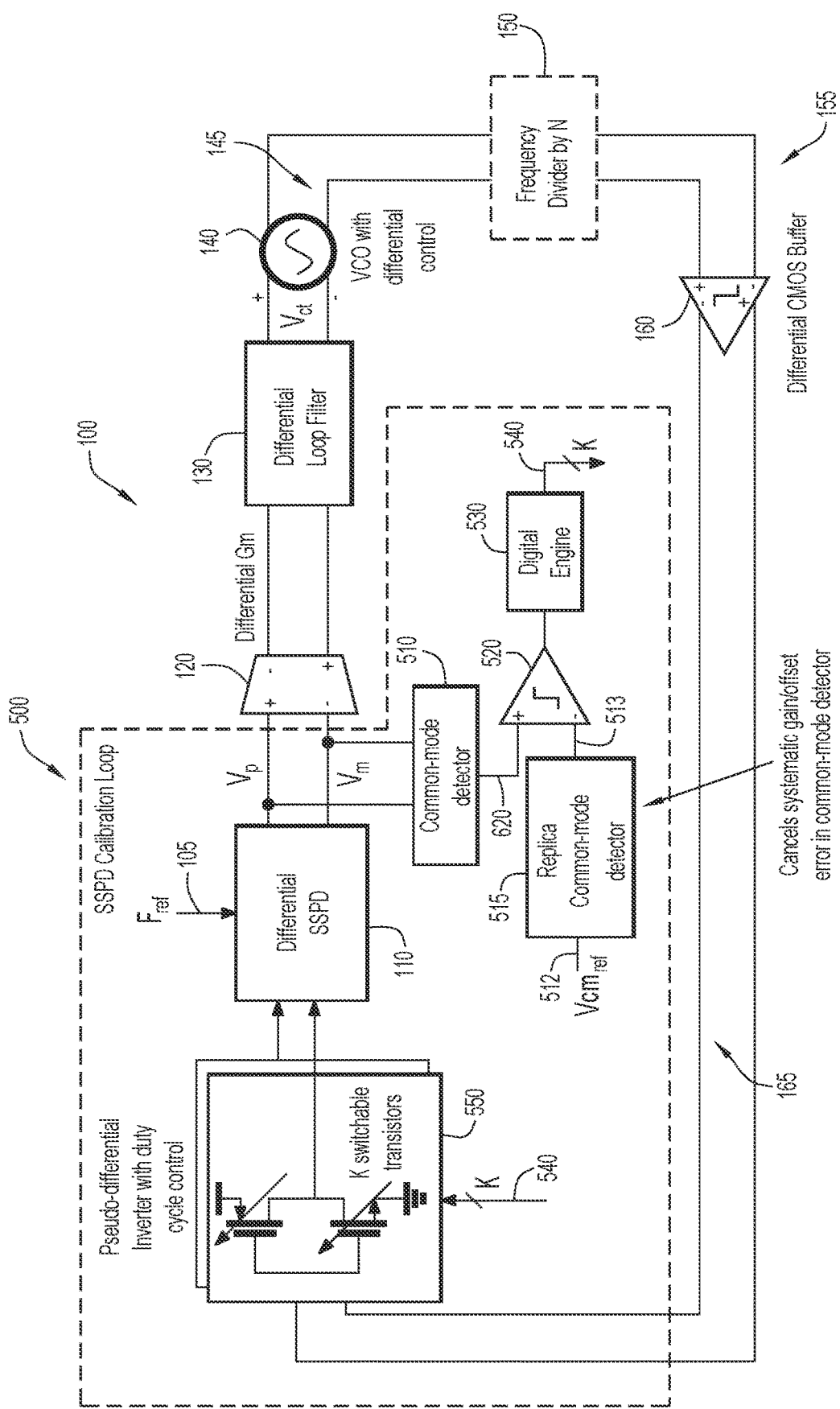
FIG. 1 is a block diagram of a sub-sampling phase locked loop (PLL) including a calibration loop for a differential sub-sampling phase detector (SSPD), according to an example embodiment.

Presented herein are techniques for implementing a differential sub-sampling phase locked loop (PLL). A method includes detecting a common-mode voltage on an output of a differential sub-sampling phase detector operating in the differential sub-sampling phase locked loop, and controlling, based on the common-mode voltage, a duty cycle of a feedback signal of the differential sub-sampling phase locked loop that is fed back to the differential sub-sampling phase detector.

In another embodiment, a device is provided. The device includes a differential sub-sampling phase detector, a differential transconductance amplifier in communication with an output of the differential sub-sampling phase detector, a differential loop filter in communication with an output of the differential transconductance amplifier, a voltage controlled oscillator in communication with an output of the differential loop filter, and a duty cycle control circuit configured to supply a duty-cycle controlled form of an output of the voltage controlled oscillator to the differential sub-sampling phase detector.

In still another embodiment a device includes, as a calibration loop for a differential sub-sampling phase detector, a duty cycle control circuit configured to supply a duty-cycle controlled form of an output of a voltage controlled oscillator of a phase locked loop to the differential sub-sampling phase detector.

EXAMPLE EMBODIMENTS

As noted, a PLL is one of the more critical functional blocks in an integrated circuit chip. In a wireline system, multiple clock generators are used on a single chip to accommodate multi-lane communication. Very low jitter clocks are preferred in order to reduce the error that can result from small timing margins associated with increased data rates, e.g., 200G/λ, and beyond. Thus, PLLs with low phase noise, small area, and low spurious tones are desired. Likewise, a wireless system benefits from low integrated phase error of a carrier to reduce the error vector magnitude (EVM). Spurious tones in the carrier are preferably minimized to improve adjacent channel suppression, and phase noise of the carrier is preferably minimized to reduce reciprocal mixing. Thus, again, there is a demand for improved PLL performance.

To address this demand, and in accordance with an embodiment, a differential sub-sampling PLL is provided that includes a calibration loop for a differential sub-sampling phase detector (SSPD) that is part of the overall sub-sampling PLL design. The disclosed sub-sampling PLL can alleviate the problem of common-mode noise and even-order Kvco nonlinearity. The SSPD calibration loop is implemented, particularly, for the differential sub-sampling PLL operating at high-frequency where a frequency divider is used in the feedback. In accordance with an embodiment, the SSPD calibration loop automatically sets the output common-mode voltage of the differential SSPD, and further adjusts the duty cycle of the frequency divided fed back waveform to ensure a locking point near the mid-point of the waveform. The SSPD calibration loop can be used to build robust differential sub-sampling PLLs with linearized differential varactors in the VCO.

Reference is now made to the figures, beginning with FIG. 1, which is a block diagram of a differential sub-sampling phase locked loop (PLL) 100 including a SSPD calibration loop 500 for a differential sub-sampling phase detector (SSPD) 110, according to an example embodiment. Specifically, a frequency reference signal $F_{ref}$ 105 is supplied to differential SSPD 110 where $F_{ref}$ is compared with a fed back signal of sub-sampling PLL 100. A differential output of differential SSPD 110, namely $V_p$, $V_m$, is supplied to a differential transconductance amplifier, i.e., differential Gm 120, which is connected to a differential loop filter 130. Differential loop filter 130 outputs a differential control voltage, $V_{ct}$, which is supplied to voltage controlled oscillator (VCO) 140. VCO 140 outputs a differential clock Vout 145 whose frequency is dependent on the voltage $V_{ct}$, and VCO gain Kvco. Differential clock Vout 145 may then be supplied, e.g., to other portions of an overall receiver chip (not shown). The differential sub-sampling PLL 100 includes a feedback loop 155 comprising, optionally, a frequency divide-by-N block 150, which provides a frequency divided waveform to differential CMOS buffer 160, which, in turn, supplies a differential feedback waveform 165 to a pseudo-differential inverter based buffer with duty cycle control, or, more simply, duty cycle control block 550. Duty cycle control block 550, as is further described below, is part of SSPD calibration loop 500. Thus, in alternate implementation, the frequency divide-by-N block 150 can be eliminated from feedback loop 155 and VCO 140 outputs can directly feed to differential CMOS buffer 160.

More specifically, SSPD calibration loop 500 (see also FIG. 5) comprises a common-mode detector 510, which detects a common mode voltage carried by the differential output $V_p$, $V_m$ of differential SSPD 110. An output of common-mode detector 510, i.e., $(k_{cm}(V_p+V_m)/2)$ is presented to a positive (a first) input of a comparator 520. The value $k_{cm}$ is the gain of common-mode detector 510. A replica common-mode detector 515 receives a common-mode reference voltage $Vcm_{ref}$ 512, and outputs a signal 513 configured to cancel systematic gain/offset error in common-mode detector 510. The circuitry inside replica common-mode detector 515, is identical to the one inside common-mode detector 510, hence it exhibits the same gain (also systematic offset) as common-mode detector 510. Output signal 513 (i.e., $kcm*Vcm_{ref}$) of replica common-mode detector 515 is presented to a negative (a second) input of comparator 520. Comparator 520 outputs a digital/binary signal +1 or −1, based on the difference between its input signals 620 and 513. The common-mode voltage detected by common-mode detector 510 is then supplied to a digital engine 530. Digital engine 530, in one possible embodiment, runs a least-mean-square (LMS) algorithm that is configured to ensure that the long-term average of an output signal of comparator 520 is zero. Digital engine 530 outputs a K-wide digital signal 540, where the integer number K matches a number of bits used by duty cycle control block 120 to control the duty cycle of the differential feedback waveform 165. For example, K can be the number of switchable transistors 580 sized in a binary-weighted fashion with respect to each other in duty cycle control block 550.

Figure 2:
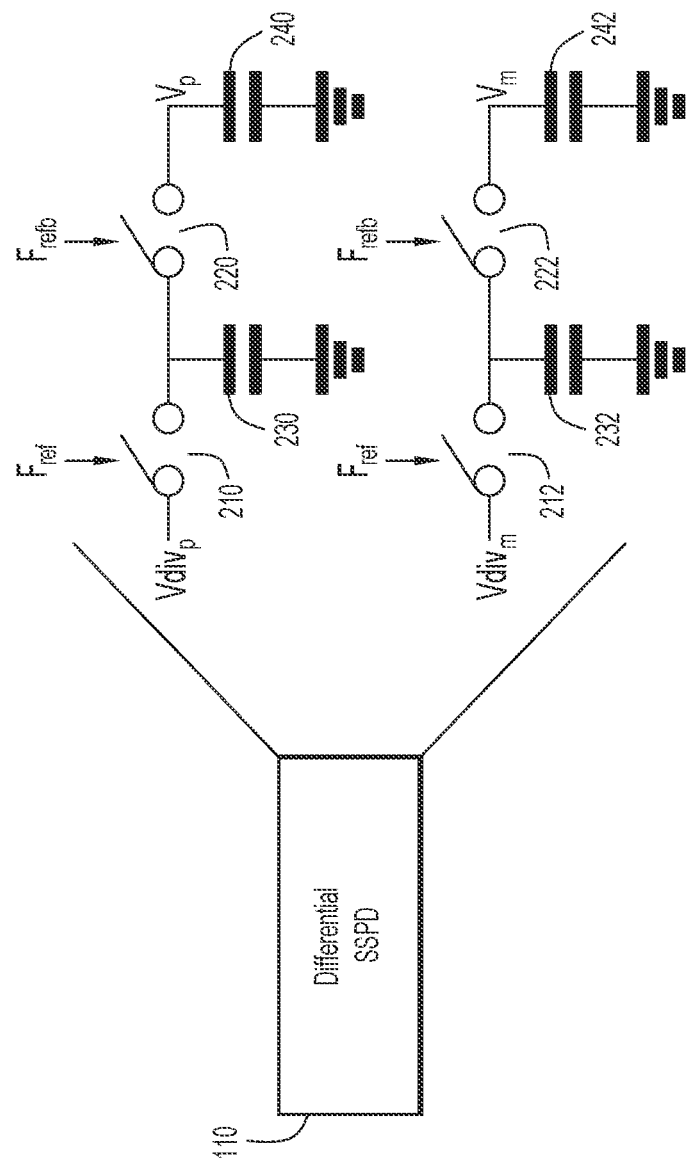
FIG. 2 is a circuit diagram of the differential SSPD employed in the sub-sampling PLL, according to an example embodiment.

FIG. 2 is a circuit diagram of differential SSPD 110 employed in differential sub-sampling PLL 100, according to an example embodiment. As shown, the differential frequency divided outputs of duty cycle control block 550 $Vdiv_p$ and $Vdiv_m$ (again, see also FIG. 5) are applied to capacitors 230, 240, 232, 242 via switches 210, 220, 212, 222, which are controlled by a differential form of Fref 105, namely Fref and $Fref_b$. Differential output voltages Vp and Vm are representative of a phase difference between the differential frequency divided outputs of duty cycle control block 550 $Vdiv_p$ and $Vdiv_m$ and Fref and $Fref_b$. Specifically, differential SSPD 110 directly samples the incoming divided rail-to-rail differential high-slope signal.

The gain of differential SSPD 110 is.

$$Gain_{sspd}=\Delta vpm/\Delta \varphi divin=2\times slope\times \omega \; div$$

That is, the gain of differential SSPD 110, which is measured as the change in output voltage ($\Delta vpm$) to the change in input phase difference ($\Delta \varphi divin$) is proportional to the input slope. A higher slope, means higher gain and lower Gm and loop filter noise at the output of the PLL due to higher suppression of their respective noise. But with higher gain, the output common-mode voltage of differential SSPD 110 is more sensitive to duty cycle variation of the input divided clock. Differential implementation of SSPD also improves the SNR of the fed back phase-difference signal $\Delta vpm$ by 3 dB due to doubling of the gain, thus reducing the noise contribution from stages following the SSPD, i.e., differential Gm 120 and differential loop filter 130.

Figure 3A:
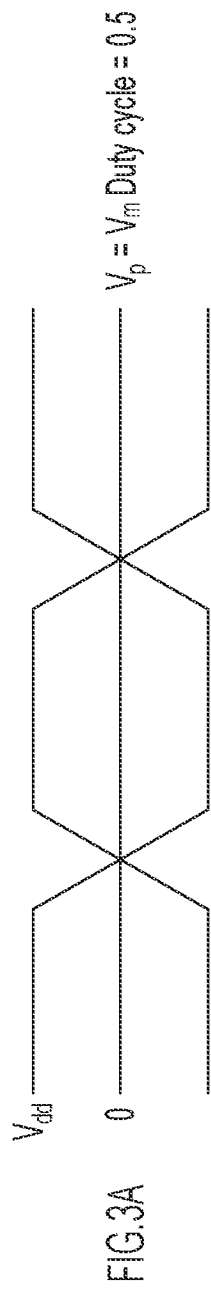
FIGS. 3A-3C are graphs showing SSPD lock-points for different input duty cycle settings of a duty cycle control block disposed in a feedback loop of the sub-sampling PLL, according to an example embodiment.
Figure 3B:
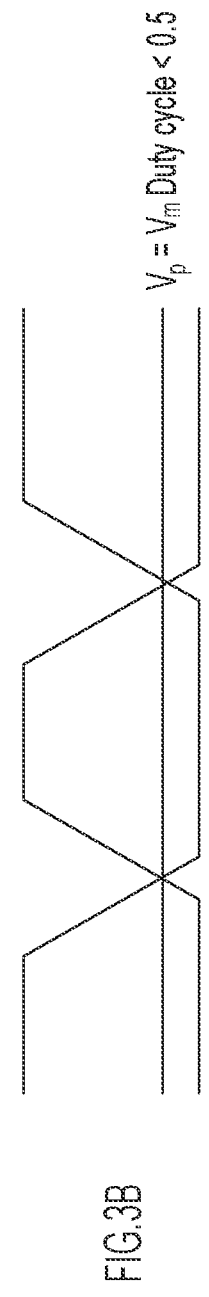
Figure 3C:
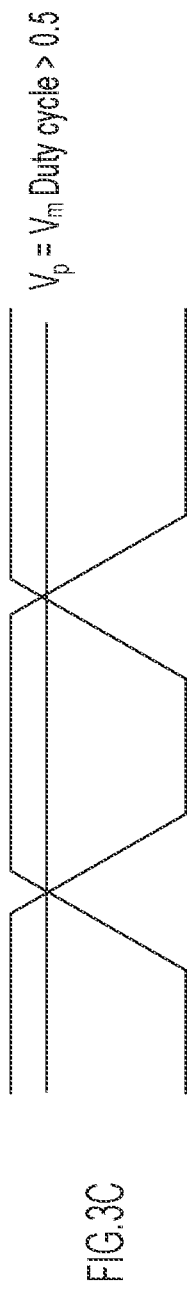

FIGS. 3A-3C are graphs showing differential SSPD 110 lock-points for different input duty cycle settings of duty cycle control block 550 disposed in the feedback loop of sub-sampling PLL 100, according to an example embodiment. As shown in FIG. 3A, the duty cycle of duty cycle control block 550 is set at 0.5 when Vp=Vm, which is the condition when sub-sampling PLL 100 locks. FIGS. 3B and 3C show, respectively, the impact of greater than and less than 0.5 duty cycle settings for duty cycle control block 550 when Vp=Vm, and where differential sub-sampling PLL 100 locks. That is, in the presence of duty cycle error in the divided (high-slope) waveform, the input common-mode voltage of differential Gm 120 shifts away from the desired operating point of Vdd/2, leading to change in its value.

Figure 4:
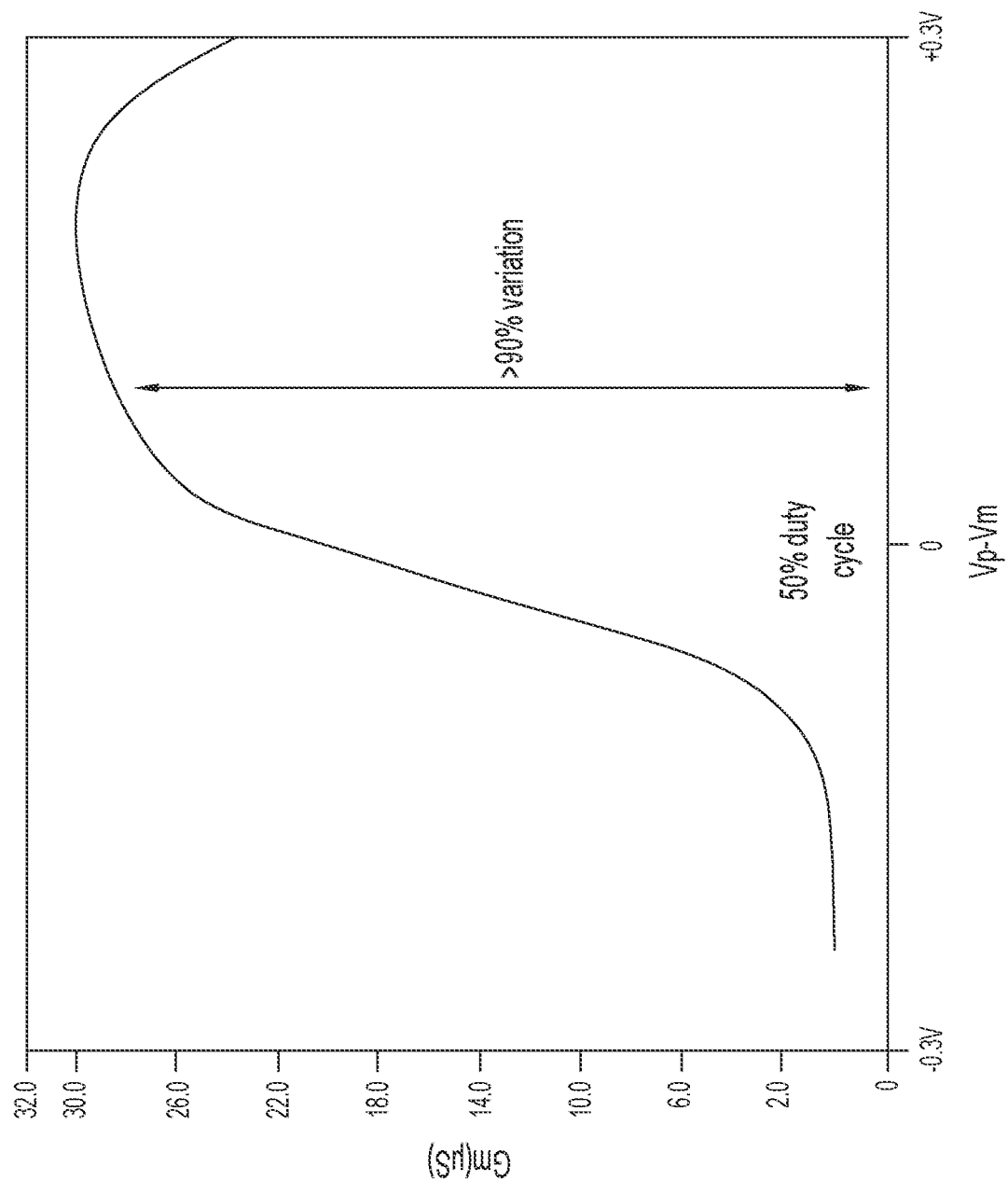
FIG. 4 depicts a graph showing the variation of transconductance gain versus common mode voltage.

FIG. 4 depicts a graph showing the possible variation of transconductance gain versus its input common mode voltage, which is equal to the output common-mode voltage of SSPD 110. As those skilled in the art will appreciate, the output common-mode voltage variation can cause a significant change in Gm (Siemens, S) of a transconductance amplifier thereby changing PLL parameters and phase noise. SSPD calibration loop 500 described herein helps to reduce this undesirable effect of common-mode voltage variation.

Figure 5:
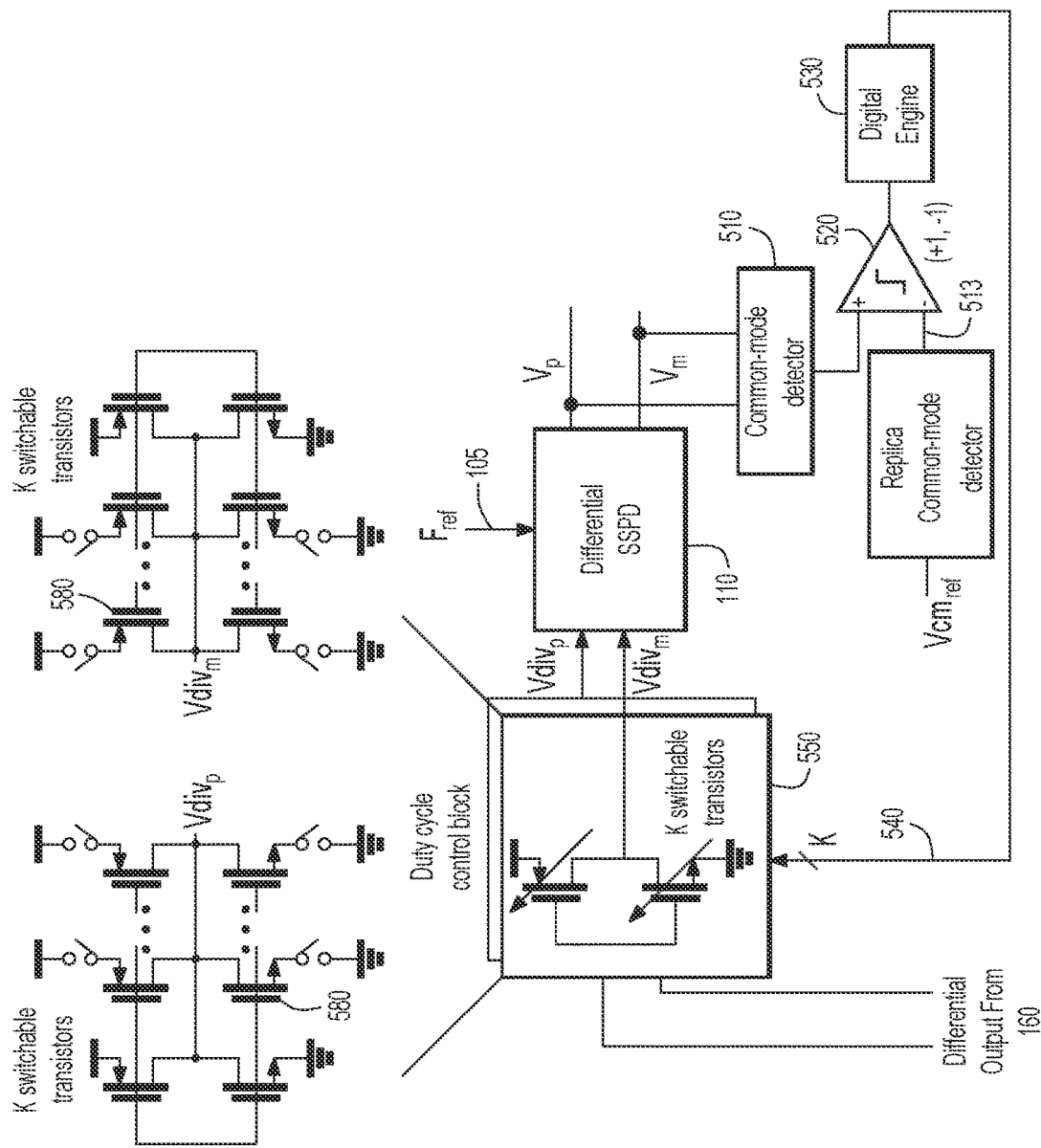
FIG. 5 depicts a portion of FIG. 1 including a circuit diagram of the duty cycle control block, according to an example embodiment.
Figure 6:
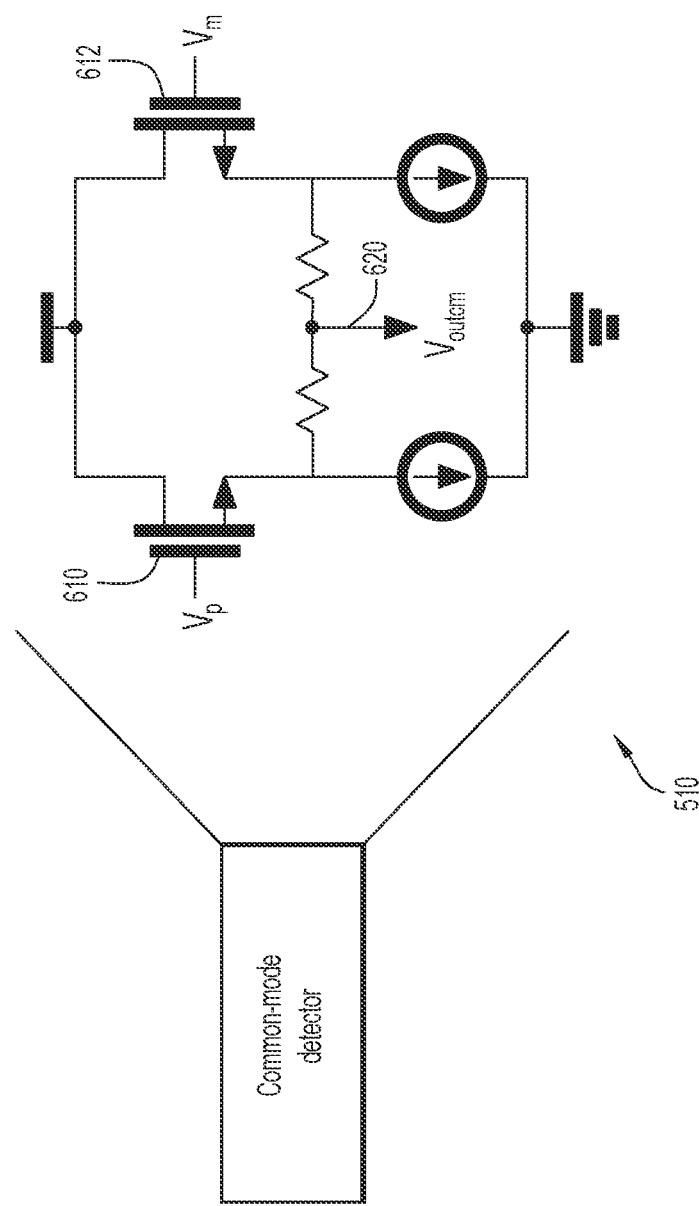
FIG. 6 is a circuit diagram of a common-mode detector employed in the calibration loop for the differential SSPD, according with an example embodiment.

Reference is now made to FIGS. 5 and 6, which are used to more fully explain SSPD calibration loop 500. FIG. 5 depicts a portion of FIG. 1 including a circuit diagram of duty cycle control block 550, according to an example embodiment, and FIG. 6 is a circuit diagram of common-mode detector 510 employed in SSPD calibration loop 500, according to an example embodiment. Those skilled in the art will appreciate that the circuits of FIGS. 5 and 6 are examples only, and other implementations are possible. Turning first to FIG. 6, common-mode detector 510 comprises a pair of matched transistors 610, 612 that are controlled respectively by differential output voltages Vp and Vm. An output $V_{outcm}$ 620 is supplied to comparator 520, as shown in FIG. 5.

That is, common-mode detector 510 senses the common-mode output of differential SSPD 110. Output $V_{outcm}$ 620 is then compared, at comparator 520, with a reference voltage (generated by replica common-mode detector 515), and a 1-bit output (+1, −1) of comparator 520 is supplied to digital engine 530, whose output is used to adjust the duty cycle of the divided waveform (fed back by feedback loop 155) to ensure the zero-crossing (i.e., the time instant where the output Vp=Vm) is near the mid-point, i.e., Vdd/2. More specifically, K-wide digital signal 540 is applied to enable or disable switchable transistors 580 in each of the differential lines of differential feedback waveform 165 passing through duty cycle control block 550. Adjusting the ratio of number of switchable transistors 580 (and more specifically, P-channel metal-oxide-semiconductor (PMOS) to N-channel metal-oxide-semiconductor (NMOS) transistors) correspondingly adjusts the rise and fall times of the node voltages Vdivp and Vdivm, which are the inputs to the differential SSPD 110 so that the zero crossing of the differential waveform to the input of the differential SSPD 110 is close to Vdd/2. Thus, by enabling or disabling the nmos or pmos transistors, duty cycle control block 550 sets the duty cycle of the input waveforms input to differential SSPD 110 close to 50%. Those skilled in the art will appreciate that there are ways to control duty cycle using elements other than switchable transistors 580, including, e.g., capacitors and/or resistors. Thus, more generally, K-wide digital signal 540 may be applied to one more "units" that can achieve the desired duty cycle control.

Those skilled in the art will appreciate that SSPD calibration loop 500 ensures that the input common-mode voltage of differential Gm 120 is substantially constant across process, voltage, temperature (PVT) and component mismatch. This ensures that the variation of Gm across PVT is less, thereby reducing the phase noise and bandwidth variation of the PLL.

Figure 7:
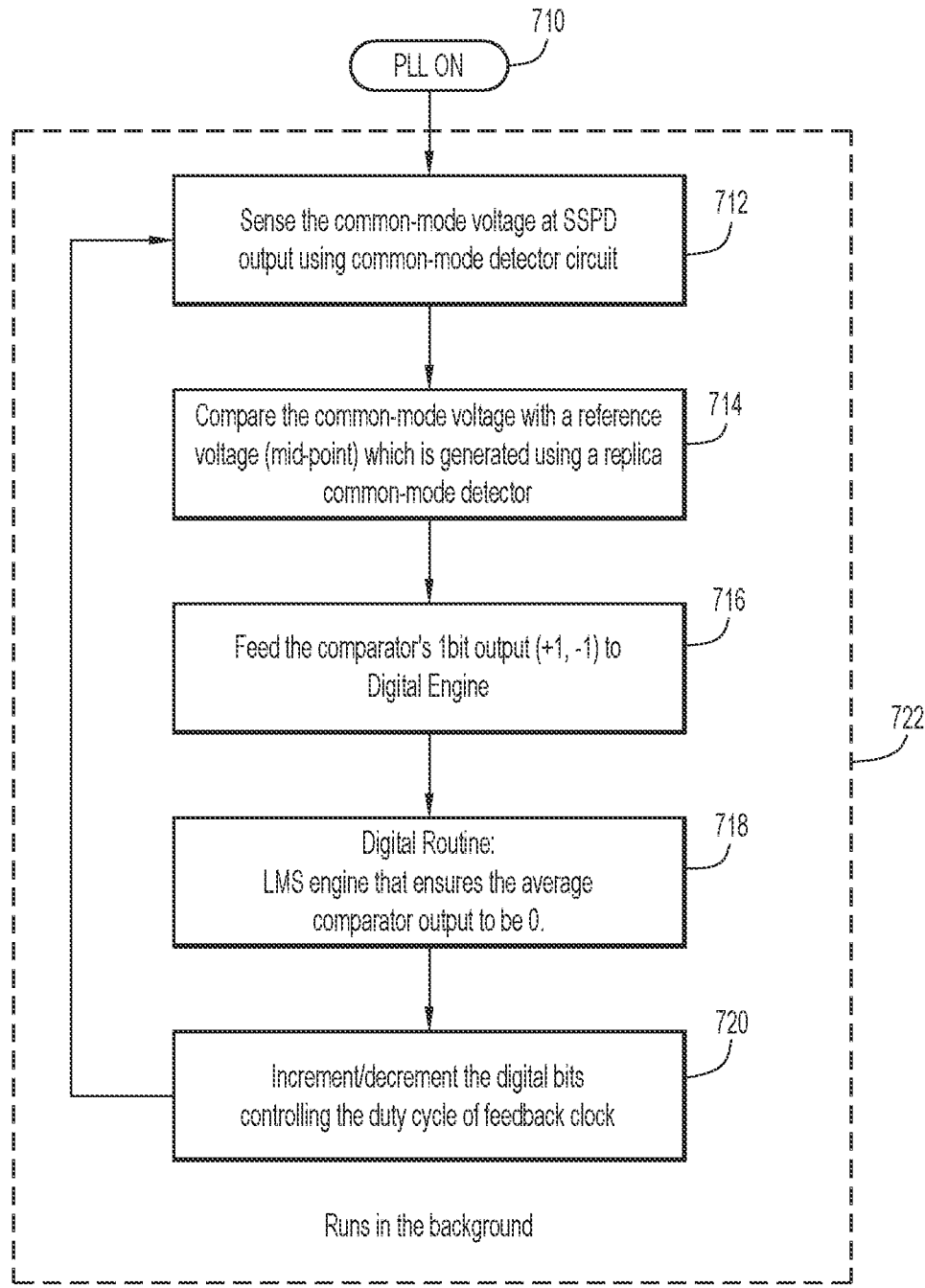
FIG. 7 is a flow chart showing a series of operations for executing a calibration loop for the differential SSPD, according to an example embodiment.

FIG. 7 is a flow chart showing a series of operations for executing a calibration loop for a differential SSPD in a differential PLL, according to an example embodiment. At 710, the PLL is powered on. At 712, an operation includes sensing the common-mode voltage at an output of a differential SSPD using a common-mode detector. At 714, an operation includes comparing, with a comparator, the common-mode voltage with a reference voltage (mid-point), which is generated using a replica common-mode detector. At 716, an operation includes feeding or supplying the comparator's 1-bit output (+1, −1) to a digital engine. At 718, the digital engine executes a least mean square (LMS) routine that ensures that the average output of the comparator is zero. At 720, an operation includes incrementing or decrementing digital bits to control operation of individual switchable transistors, and thereby control a duty cycle of a feedback clock (e.g., differential feedback waveform 165 via feedback loop 155). As suggested by block 722, operations 712, 714, 716, 718, and 720 may always run while the PLL is powered on.

Figure 8:
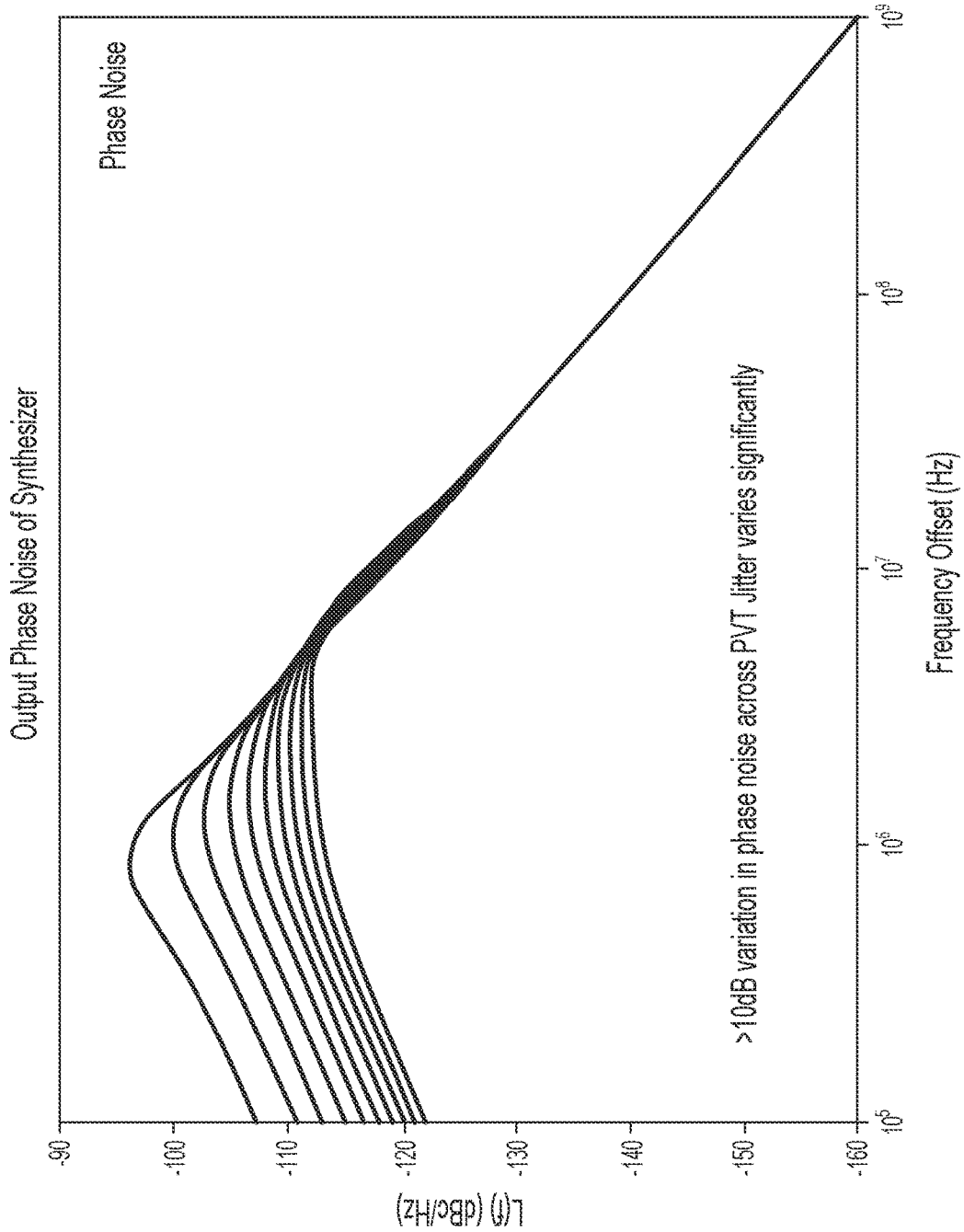
FIG. 8 is a graph showing simulated output phase noise spectrum of a PLL model without duty cycle calibration.
Figure 9:
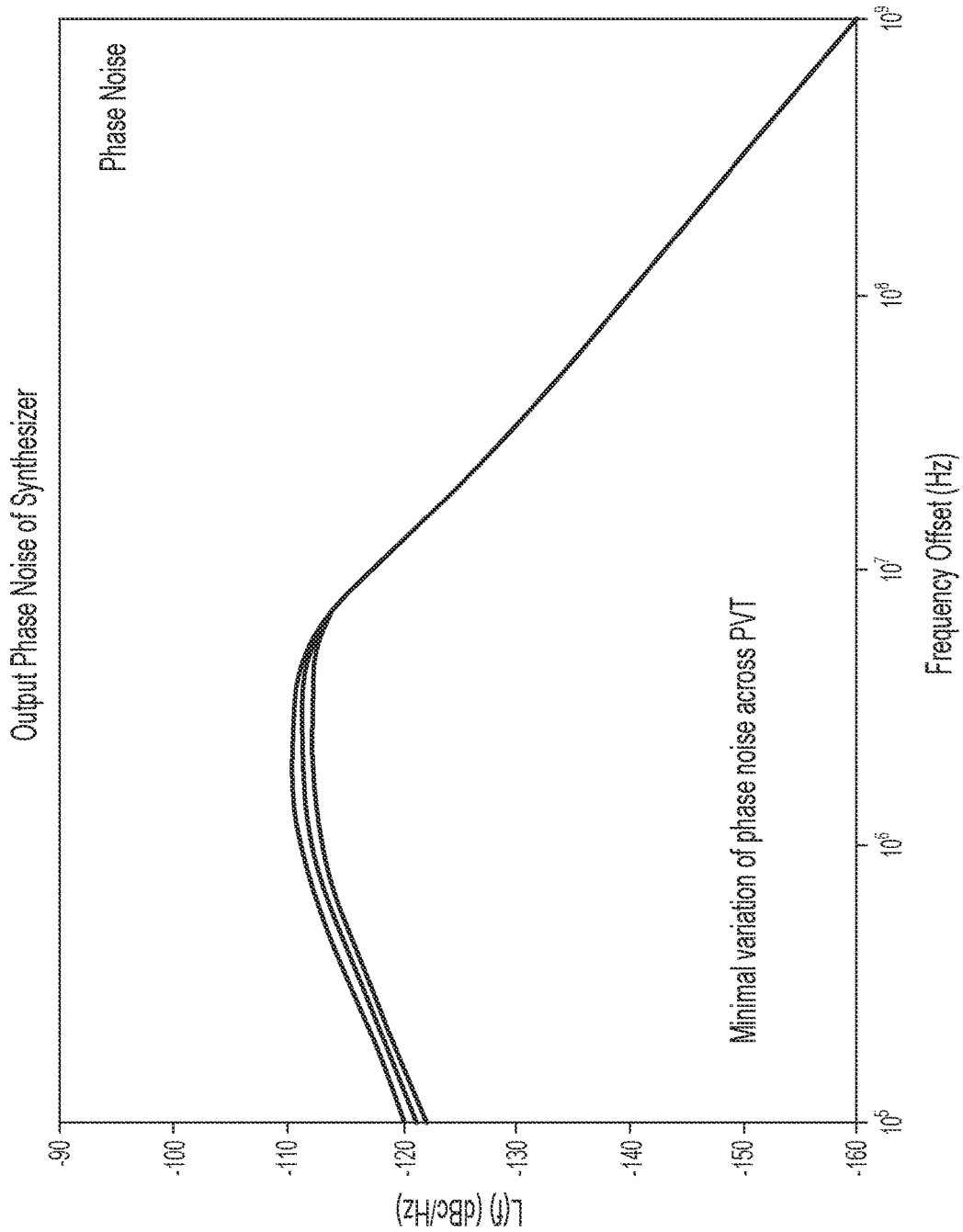
FIG. 9 is a graph showing simulated output phase noise spectrum of a PLL model with duty cycle calibration, according to an example embodiment.

FIG. 8 is a graph showing simulated output phase noise spectrum of a PLL model without duty-cycle calibration. And, for comparison, FIG. 9 is a graph showing simulated output phase noise spectrum of a PLL model with duty-cycle calibration, according to an example embodiment. According to the simulation, and as can be seen from the graphs, the jitter variation across process, voltage and temperature is reduced considerably. Without calibration phase noise can vary more than 10 dB in some cases.

With SSPD calibration loop 500, the output common-mode of differential SSPD 110 will be close to Vdd/2 or the mid-point, thus greatly reducing differential Gm 120 performance variation across PVT. Simulations show that, without duty-cycle correction, the absolute value of the transconductance of differential Gm 130 can vary by −70% to +10%. With correction, using SSPD calibration loop 500 described herein, the variation can be reduced to 10% due to mismatch in common-mode detector 510 and comparator 520 used in SSPD calibration loop 500.

Thus, those skilled in the art will appreciate that the SSPD calibration loop described herein reduces the jitter variation across PVT in a PLL that uses a differential sub-sampling phase detector. The SSPD calibration loop automatically sets the output common-mode voltage of a differential sub-sampling phase detector. The SSPD calibration loop also adjusts the duty cycle of the divided waveform to ensure a locking point near the mid-point of the waveform. The SSPD calibration loop further reduces the bandwidth variation of a sub-sampling or sampling PLL across PVT. And the SSPD calibration loop can be used to build completely differential sub-sampling Frac-N PLL with linearized differential VCO varactors.

Figure 10:
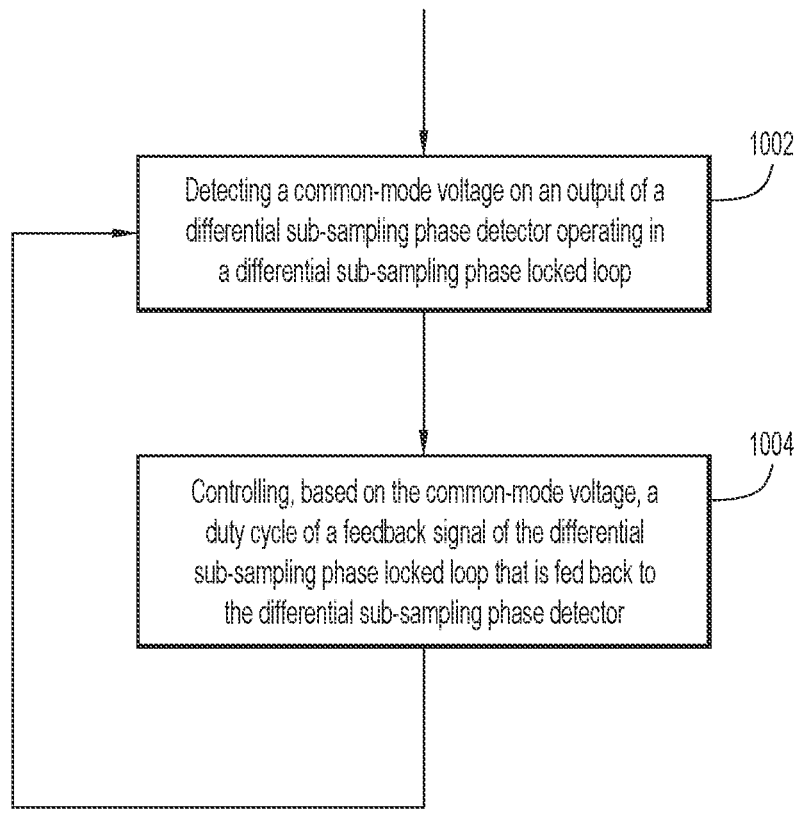
FIG. 10 is a flow chart showing a series of operations for executing a calibration loop for a differential SSPD, according to an example embodiment

FIG. 10 is a flow chart showing a series of operations for executing a calibration loop for a differential SSPD, according to an example embodiment. After power up of a PLL, and at 1002, an operation includes detecting a common-mode voltage on an output of a differential sub-sampling phase detector operating in a differential sub-sampling phase locked loop, and, at 1004, an operation includes controlling, based on the common-mode voltage, a duty cycle of a feedback signal of the differential sub-sampling phase locked loop that is fed back to the differential sub-sampling phase detector. The operations may repeat for as long as the PLL is powered on.

Figure 11:
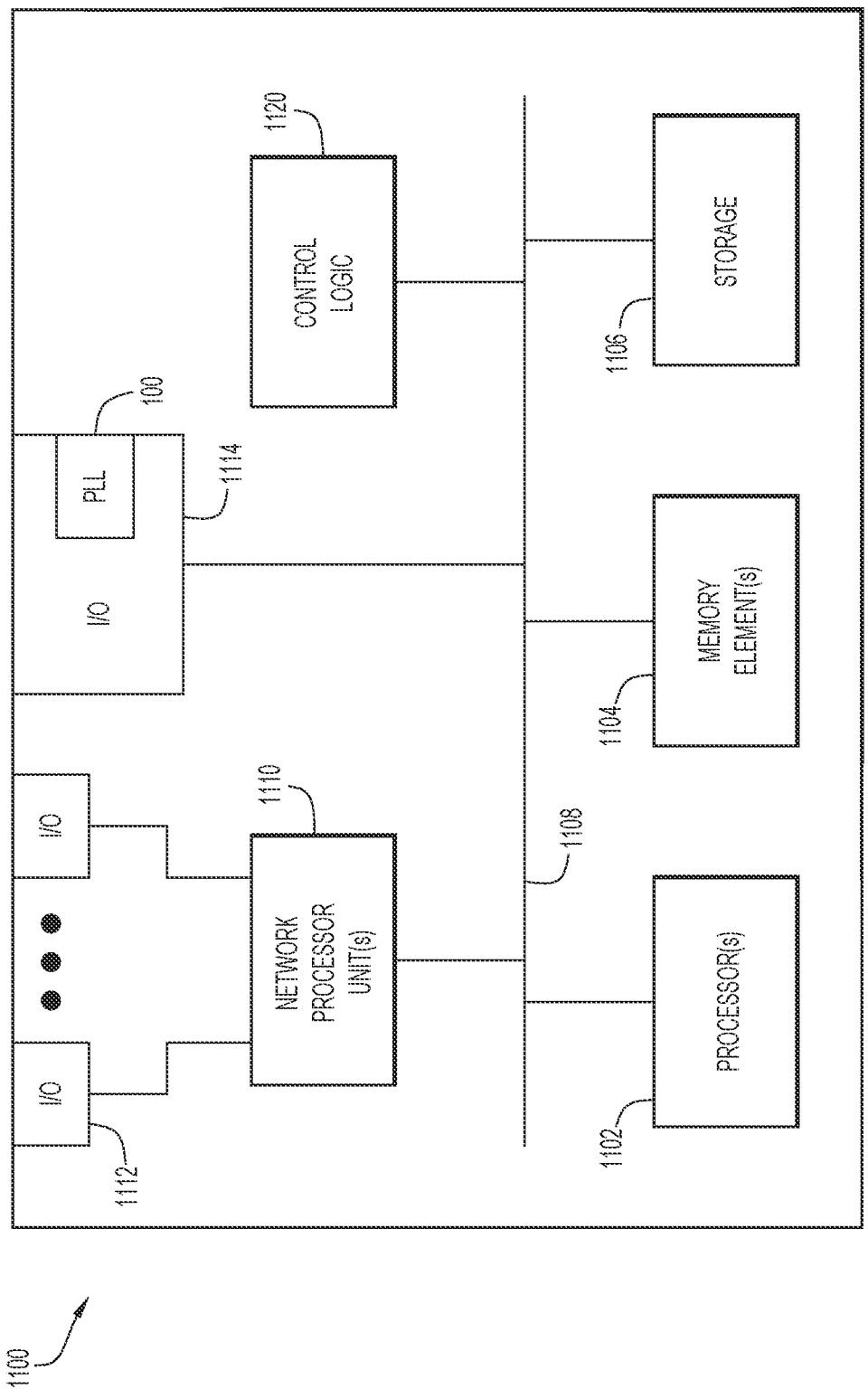
FIG. 11 is a block diagram of a device that may be configured to include differential sub-sampling phase locked loop (PLL), according to an example embodiment.

FIG. 11 is a block diagram of a computing device 1100 that may be configured to include differential sub-sampling phase locked loop (PLL) 100, according to an example embodiment. In at least one embodiment, the computing device 1100 may include one or more processor(s) 1102, one or more memory element(s) 1104, storage 1106, a bus 1108, one or more network processor unit(s) 1110 interconnected with one or more network input/output (I/O) interface(s) 1112, one or more I/O interface(s) 1114, and control logic 1120. In various embodiments, instructions associated with logic for computing device 1100 can overlap in any manner and are not limited to the specific allocation of instructions and/or operations described herein.

In at least one embodiment, processor(s) 1102 is/are at least one hardware processor configured to execute various tasks, operations and/or functions for computing device 1100 as described herein according to software and/or instructions configured for computing device 1100. Processor(s) 1102 (e.g., a hardware processor) can execute any type of instructions associated with data to achieve the operations detailed herein. In one example, processor(s) 1102 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 1104 and/or storage 1106 is/are configured to store data, information, software, and/or instructions associated with computing device 1100, and/or logic configured for memory element(s) 1104 and/or storage 1106. For example, any logic described herein (e.g., control logic 1120) can, in various embodiments, be stored for computing device 1100 using any combination of memory element(s) 1104 and/or storage 1106. Note that in some embodiments, storage 1106 can be consolidated with memory element(s) 1104 (or vice versa), or can overlap/exist in any other suitable manner.

In at least one embodiment, bus 1108 can be configured as an interface that enables one or more elements of computing device 1100 to communicate in order to exchange information and/or data. Bus 1108 can be implemented with any architecture designed for passing control, data and/or information between processors, memory elements/storage, peripheral devices, and/or any other hardware and/or software components that may be configured for computing device 1100. In at least one embodiment, bus 1108 may be implemented as a fast kernel-hosted interconnect, potentially using shared memory between processes (e.g., logic), which can enable efficient communication paths between the processes.

In various embodiments, network processor unit(s) 1110 may enable communication between computing device 1100 and other systems, entities, etc., via network I/O interface(s) 1112 (wired and/or wireless) to facilitate operations discussed for various embodiments described herein. In various embodiments, network processor unit(s) 1110 can be configured as a combination of hardware and/or software, such as one or more Ethernet driver(s) and/or controller(s) or interface cards, Fibre Channel (e.g., optical) driver(s) and/or controller(s), wireless receivers/transmitters/transceivers, baseband processor(s)/modem(s), and/or other similar network interface driver(s) and/or controller(s) now known or hereafter developed to enable communications between computing device 1100 and other systems, entities, etc. to facilitate operations for various embodiments described herein. In various embodiments, network I/O interface(s) 1112 can be configured as one or more Ethernet port(s), Fibre Channel ports, any other I/O port(s), and/or antenna (s)/antenna array(s) now known or hereafter developed. Thus, the network processor unit(s) 1110 and/or network I/O interface(s) 1112 may include suitable interfaces for receiving, transmitting, and/or otherwise communicating data and/or information in a network environment.

I/O interface(s) 1114 allow for input and output of data and/or information with other entities that may be connected to computing device 1100. For example, I/O interface(s) 1114 may provide a connection to external devices such as a keyboard, keypad, a touch screen, and/or any other suitable input and/or output device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 1120 can include instructions that, when executed, cause processor(s) 1102 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof, and/or the like to facilitate various operations for embodiments described herein.

The programs described herein (e.g., control logic 1120) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, entities as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 1104 and/or storage 1106 can store data, software, code, instructions (e.g., processor instructions), logic, parameters, combinations thereof, and/or the like used for operations described herein. This includes memory element(s) 1104 and/or storage 1106 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™, mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

In sum, in one embodiment a method is provided. The method may include detecting a common-mode voltage on an output of a differential sub-sampling phase detector operating in a differential sub-sampling phase locked loop, and controlling, based on the common-mode voltage, a duty cycle of a feedback signal of the differential sub-sampling phase locked loop that is fed back to the differential sub-sampling phase detector.

The method may further include detecting the common-mode voltage with a common-mode detector, supplying an output of the common-mode detector to a first input of a comparator, operating a replica common-mode detector, and supplying an output of the replica common-mode detector to a second input of the comparator.

The method may further include supplying an output of the comparator to a digital engine.

The method may also include generating a K-wide digital signal based on the output of the comparator. The method may include supplying the K-wide digital signal to K or more switchable transistors, depending on the implementation, that control the duty cycle of the feedback signal of the differential sub-sampling phase locked loop. And, the method may include controlling the duty cycle of the feedback signal based on a number of the K switchable transistors that are enabled or disabled given the K-wide digital signal.

The method may still further include executing, by the digital engine, a least mean square routine that causes an average output of the comparator to be zero.

The method may also include controlling a voltage controlled oscillator with a differential control signal generated by a differential loop filter of the differential sub-sampling phase locked loop.

The method may include frequency dividing an output of the differential sub-sampling phase locked loop to generate the feedback signal of the differential sub-sampling phase locked loop.

With the disclosed method, a variation of jitter of the differential sub-sampling phase locked loop across process, voltage, temperature (PVT) is reduced compared to variation of jitter of an identical differential sub-sampling phase locked loop, but without duty cycle control of a feedback signal.

A device may also be provided. The device may include differential sub-sampling phase detector, a differential transconductance amplifier in communication with an output of the differential sub-sampling phase detector, a differential loop filter in communication with an output of the differential transconductance amplifier, a voltage controlled oscillator in communication with an output of the differential loop filter, and a duty cycle control circuit configured to supply a duty-cycle controlled form of an output of the voltage controlled oscillator to the differential sub-sampling phase detector.

The device may also include a sub-sampling phase detector control loop that controls operation of the duty cycle control circuit.

In an embodiment, the sub-sampling phase detector control loop includes a common-mode detector arranged to detect a common-mode voltage carried by the output of the differential sub-sampling phase detector.

The device may still further include a replica common-mode detector and a comparator, the comparator arranged to receive, at first input thereof, an output of the common-mode detector, and further arranged to receive, at a second input thereof, an output of the replica common-mode detector.

The device may also include a digital engine arranged to receive an output of the comparator. The digital engine may be configured to generate a K-wide digital signal based on the output of the comparator, wherein the K-wide digital signal is used to control the duty cycle of the output of the voltage controlled oscillator using K programmable units.

In another embodiment, a device is provided and includes a differential sub-sampling phase detector, and a sub-sampling phase detector calibration loop comprising a duty cycle control circuit configured to supply a duty-cycle controlled form of an output of a voltage controlled oscillator of a phase locked loop to the differential sub-sampling phase detector.

In the device, the duty cycle control circuit may include K or more programmable units depending on the implementation. In an embodiment, the device may include K binary weighted programmable units or a combination of binary and thermometer coded programmable units.

In the device, the K programmable units may be respectively enabled or disabled based on a common-mode voltage carried by an output of the differential sub-sampling phase detector.

The device may also include a common-mode detector, a replica common-mode detector, and a comparator, wherein an output of the common-mode detector may be supplied to a first input of the comparator, and the output of the replica common-mode detector is supplied to a second input of the comparator.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A method comprising:
   detecting a common-mode voltage on an output of a differential sub-sampling phase detector operating in a differential sub-sampling phase locked loop; and
   controlling, based on the common-mode voltage, a duty cycle of a feedback signal of the differential sub-sampling phase locked loop that is fed back to the differential sub-sampling phase detector.

2. The method of claim 1, further comprising detecting the common-mode voltage with a common-mode detector;
   supplying an output of the common-mode detector to a first input of a comparator;
   operating a replica common-mode detector; and
   supplying an output of the replica common-mode detector to a second input of the comparator.

3. The method of claim 2, further comprising supplying an output of the comparator to a digital engine.

4. The method of claim 2, further comprising generating a K-wide digital signal based on the output of the comparator.

5. The method of claim 4, further comprising supplying the K-wide digital signal to K switchable transistors that control the duty cycle of the feedback signal of the differential sub-sampling phase locked loop.

6. The method of claim 5, further comprising controlling the duty cycle of the feedback signal based on a number of the K switchable transistors that are enabled given the K-wide digital signal.

7. The method of claim 3, further comprising executing, by the digital engine, a least mean square routine that causes an average output of the comparator to be zero.

8. The method of claim 1, further comprising controlling a voltage controlled oscillator with a differential control signal generated by a differential loop filter of the differential sub-sampling phase locked loop.

9. The method of claim 1, further comprising frequency dividing an output of the differential sub-sampling phase locked loop to generate the feedback signal of the differential sub-sampling phase locked loop.

10. The method of claim 1, wherein variation of jitter of the differential sub-sampling phase locked loop across process, voltage, temperature (PVT) is reduced compared to variation of jitter of an identical differential sub-sampling phase locked loop, but without duty cycle control of a feedback signal.

11. A device comprising:
    a differential sub-sampling phase detector;
    a differential transconductance amplifier in communication with an output of the differential sub-sampling phase detector;

a differential loop filter in communication with an output of the differential transconductance amplifier;

a voltage controlled oscillator in communication with an output of the differential loop filter; and a duty cycle control circuit configured to supply a duty-cycle controlled form of an output of the voltage controlled oscillator to the differential sub-sampling phase detector.

12. The device of claim 11, further comprising a sub-sampling phase detector control loop that controls operation of the duty cycle control circuit.

13. The device of claim 12, wherein the sub-sampling phase detector control loop comprises a common-mode detector arranged to detect a common-mode voltage carried by the output of the differential sub-sampling phase detector.

14. The device of claim 13, further comprising a replica common-mode detector and a comparator, the comparator arranged to receive, at first input thereof, an output of the common-mode detector, and further arranged to receive, at a second input thereof, an output of the replica common-mode detector.

15. The device of claim 14, further comprising a digital engine arranged to receive an output of the comparator.

16. The device of claim 15, wherein the digital engine is configured to generate a K-wide digital signal based on the output of the comparator, wherein the K-wide digital signal is used to control a duty cycle of the output of the voltage controlled oscillator using K programmable units.

17. A device comprising:

a differential sub-sampling phase detector; and a sub-sampling phase detector calibration loop comprising a duty cycle control circuit configured to supply a duty-cycle controlled form of an output of a voltage controlled oscillator of a phase locked loop to the differential sub-sampling phase detector.

18. The device of claim 17, wherein the duty cycle control circuit comprises K programmable units.

19. The device of claim 18, wherein the K programmable units are respectively enabled based on a common-mode voltage carried by an output of the differential sub-sampling phase detector.

20. The device of claim 18, further comprising a common-mode detector, a replica common-mode detector, and a comparator, wherein an output of the common-mode detector is supplied to a first input of the comparator, and the output of the replica common-mode detector is supplied to a second input of the comparator.

* * * * *